(12) United States Patent
Hanawa et al.

(10) Patent No.: US 12,719,011 B2
(45) Date of Patent: Aug. 25, 2026

(54) TRANSMISSION ELECTRON MICROSCOPE

(71) Applicant: Hitachi High-Tech Corporation, Tokyo (JP)

(72) Inventors: Akinari Hanawa, Tokyo (JP); Toshie Yaguchi, Tokyo (JP); Hideki Kikuchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 363 days.

(21) Appl. No.: 18/285,782

(22) PCT Filed: Apr. 13, 2021

(86) PCT No.: PCT/JP2021/015266

§ 371 (c)(1),
(2) Date: Oct. 5, 2023

(87) PCT Pub. No.: WO2022/219699

PCT Pub. Date: Oct. 20, 2022

(65) Prior Publication Data

US 2024/0186103 A1 Jun. 6, 2024

(51) Int. Cl.
*H01J 37/153* (2006.01)
*H01J 37/18* (2006.01)
(Continued)

(52) U.S. Cl.
CPC ............ *H01J 37/153* (2013.01); *H01J 37/18* (2013.01); *H01J 37/20* (2013.01); *H01J 37/295* (2013.01); *H01J 37/32449* (2013.01)

(58) Field of Classification Search
CPC .......... H01J 37/153; H01J 37/18; H01J 37/20; H01J 37/295; H01J 37/32449; H01J 37/26; H01J 37/28
See application file for complete search history.

(56) References Cited

U.S. PATENT DOCUMENTS 4,661,968 A * 4/1987 Wondergem ........... H01J 37/20 250/398
5,065,029 A * 11/1991 Krivanek ............... H01J 37/18 850/16

(Continued)

FOREIGN PATENT DOCUMENTS

JP 10-134756 A 5/1998
JP 2008-262886 A 10/2008

(Continued)

OTHER PUBLICATIONS

International Search Report (PCT/ISA/210) issued in PCT Application No. PCT/JP2021/015266 dated Jun. 1, 2021 with English translation (4 pages).

(Continued)

*Primary Examiner* — David A Vanore
(74) *Attorney, Agent, or Firm* — Crowell & Moring LLP

(57) ABSTRACT

An object of the invention is to reduce influence of a phase contrast on an observation image in a transmission electron microscope and to enable image observation with high magnification and high resolution. The transmission electron microscope according to the invention can switch between a first mode in which a lens barrel is airtightly sealed between an electron beam source side and a stage side by a diaphragm, and a second mode in which the lens barrel is not airtightly sealed.

6 Claims, 5 Drawing Sheets

(51) Int. Cl.
*H01J 37/20* (2006.01)
*H01J 37/295* (2006.01)
*H01J 37/32* (2006.01)

(56) References Cited

U.S. PATENT DOCUMENTS

2003/0010915 A1* 1/2003 Grzelakowski ....... H01J 37/244 250/310
2009/0146075 A1* 6/2009 Schmid ................ H02N 2/0095 250/311
2010/0148087 A1* 6/2010 Doering ................ B82Y 40/00 250/396 R
2011/0180724 A1* 7/2011 Terada .................... H01J 37/20 250/442.11
2011/0303845 A1* 12/2011 Yaguchi .................. H01J 37/20 250/310
2012/0104253 A1* 5/2012 Tsuneta ................ H01J 37/263 250/307
2012/0305769 A1* 12/2012 Yaguchi .................. H01J 37/20 250/441.11
2013/0313430 A1* 11/2013 Ominami ................ H01J 37/16 250/307
2014/0246583 A1* 9/2014 Ominami ................ H01J 37/22 250/307
2015/0014531 A1* 1/2015 Yamazaki ............. H01J 37/244 250/311
2015/0179396 A1* 6/2015 Yaguchi .................. H01J 37/26 250/440.11
2015/0206705 A1* 7/2015 Sakuma .................. H01J 37/18 250/453.11
2015/0213999 A1* 7/2015 Ominami ................ H01J 37/28 250/310
2015/0221470 A1* 8/2015 Ominami ................ H01J 37/16 250/441.11
2015/0228449 A1* 8/2015 Kawanishi ............. H01J 37/18 250/307
2015/0311033 A1* 10/2015 Ominami .............. H01J 37/224 250/306
2016/0368031 A1* 12/2016 Borschel ................... B08B 5/00
2022/0244201 A1* 8/2022 Yaguchi ................ H01J 37/295
2024/0162000 A1* 5/2024 Asakura .................. H01J 37/20

FOREIGN PATENT DOCUMENTS

JP 2010-153858 A 7/2010
JP 2010-192126 A 9/2010
JP 2013-101791 A 5/2013

OTHER PUBLICATIONS

Japanese-language Written Opinion (PCT/ISA/237) issued in PCT Application No. PCT/JP2021/015266 dated Jun. 1, 2021 with English translation (7 pages).
Japanese-language International Preliminary Report on Patentability (PCT/IPEA/409) issued in PCT Application No. PCT/JP2021/015266 dated Feb. 16, 2022, including Annexes with partial English translation (14 pages).

* cited by examiner

TRANSMISSION ELECTRON MICROSCOPE

TECHNICAL FIELD

The present invention relates to a transmission electron microscope.

BACKGROUND ART

In-situ observation is observation or measurement in an actual environment in which an actual process (using method) occurs, as the etymology thereof is the meaning of "in an original place". In in-situ observation in a transmission electron microscope (TEM), a behavior of a material can be observed with resolution of the sub-angstrom-strobe by reproducing the material in the same manner as in an actual environment using conditions such as heating, cooling, and a gas atmosphere in the electron microscope.

In an in-situ observation technique, a differential exhaust throttle or an environment cell holder using diaphragms is generally used as a technique for securing a sealed space. The differential exhaust throttle can obtain exhaust conductance by using an orifice. The environment cell holder can seal a limited space by using diaphragms above and below a sample.

PTL 1, which has an object to "provide a scanning electron microscope device in which an electron gun is kept in a vacuum", discloses a technique of "a scanning electron microscope device 1 including an electron gun 2 in which an electron gun window 35 is provided with a metal film, a carbon film, a diamond film, and a diamond like carbon film that transmit accelerated electrons and are resistant to atmosphere, and an inside of a sealed container 33 is kept in a vacuum" (see Abstract).

PTL 2, which has an object to "implement a charged particle beam device capable of shielding X-rays at low cost with a simple configuration", discloses a technique in which "a gate valve 6 is disposed on a passage of an electron beam when an electron gun chamber 1 and a focusing lens chamber 3 are shielded by vacuum. At this time, although the electron beam is emitted to the gate valve, the electron beam collides with a disk 12 in an opening 11. Although X-rays x are generated by the collision of the electron beam to the disk 12, since the disk 12 is made of, for example, carbon, and since a generation amount of the X-rays is fairly small and energy of the X-rays is small, an amount of X-rays absorbed by components such as the gate valve, partition walls 4 and 5, or a wall portion of a lens barrel defining the electron gun chamber 1 or the focusing lens chamber 3 and leaked to an outside of the lens barrel is negligible" (see Abstract).

CITATION LIST

Patent Literature

PTL 1: JP2008-262886A
PTL 2: JP10-134756A

SUMMARY OF INVENTION

Technical Problem

The techniques disclosed in PTL 1 and PTL 2 are useful techniques for maintaining a gas atmosphere, but inventors of the invention have found that there are the following technical problems in a transmission electron microscope for observing a transmission image.

A using method of in-situ in a transmission electron microscope or a scanning transmission electron microscope (STEM) will be described. In recent years, stability performance of an environment cell holder using a micro electro mechanical systems (MEMS) chip or the like is improved, and high resolution of image observation in in-situ is progressing.

Contrasts for forming a TEM image include a scattering contrast, a diffraction contrast, and a phase contrast. Low-magnification observation, which has been mainly used in the in-situ observation, forms a contrast of a TEM/STEM image based on a diffraction contrast or a scattering contrast using transmitted waves or diffracted waves.

On the other hand, in TEM/STEM image observation with high magnification, an image contrast is formed based on a phase contrast using transmitted waves and diffracted waves. At this time, when a sealed space is defined using, for example, a conductive silicon nitride film, a contrast of a noncrystalline portion such as an amorphous portion is superimposed on a contrast of an actual sample. Accordingly, it is difficult to obtain a correct contrast of the TEM image.

Therefore, with the techniques for securing a sealed space disclosed in PTL 1 and PTL 2, it is difficult to obtain a high magnification TEM/STEM image in the in-situ observation. The same applies to an environment cell holder used in related art. This is because, when the environment cell holder is adopted, diaphragms for securing the sealed space are normally provided above and below a sample, and are influenced by the phase contrast.

The invention has been made in view of the above problems, and an object thereof is to reduce influence of a phase contrast on an observation image in a transmission electron microscope and to enable image observation with high magnification and high resolution.

Solution to Problem

The transmission electron microscope according to the invention can switch between a first mode in which a lens barrel is airtightly sealed between an electron beam source side and a stage side by a diaphragm, and a second mode in which the lens barrel is not airtightly sealed.

Advantageous Effects of Invention

According to the transmission electron microscope of the invention, influence of a phase contrast on an observation image can be reduced and image observation with high magnification and high resolution is possible.

DESCRIPTION OF EMBODIMENTS

Embodiment 1

Figure 1:
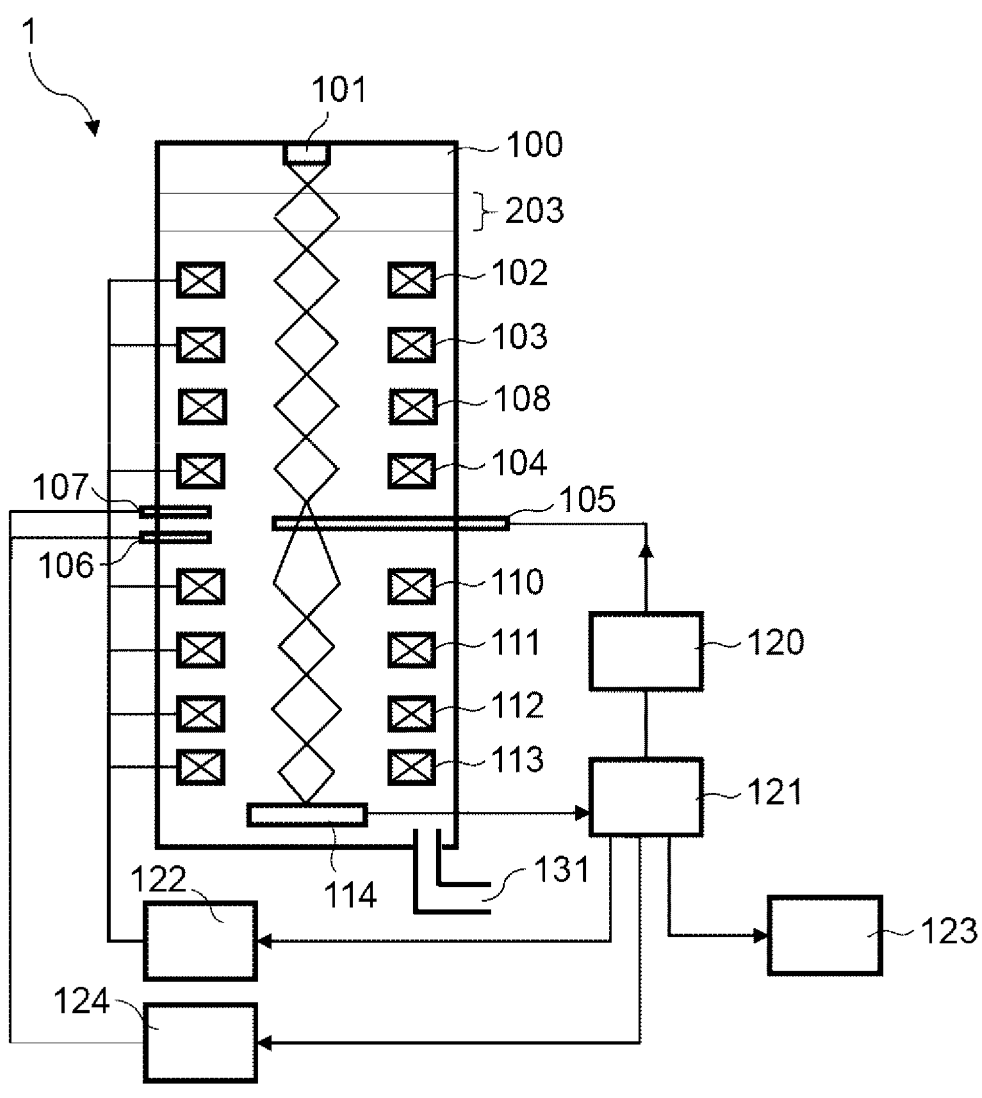
FIG. 1 is a schematic side view illustrating a configuration of a transmission electron microscope 1 according to Embodiment 1.

FIG. 1 is a schematic side view illustrating a configuration of a transmission electron microscope 1 according to Embodiment 1 of the invention. A pressure maintaining space 203 is disposed inside a lens barrel 100. A vicinity of the pressure maintaining space 203 will be described later.

An electron beam generated by an electron gun 101 is focused by irradiation lenses 102 to 104, and is emitted to a sample (not illustrated) mounted on a sample stage 105. Electrons transmitted through the sample are guided to an imaging surface of a CCD camera 114 via image forming lenses 110 to 113. An electronic image detected by the CCD camera 114 is taken into a main control device 121 and then imaged. An operator observes this image as a sample image. The sample stage 105 is controlled by a throttle control board 120 that receives a command from the main control device 121. The irradiation lenses 102 to 104 and the image forming lenses 110 to 113 are controlled by a lens control device 122 that receives a command from the main control device 121. The image imaged by the main control device 121 is displayed on a display device 123. An aberration corrector 108 will be described later.

An inside of the lens barrel 100 is evacuated to about $10^{-5}$ Pa by an evacuation pump 131. A vacuum gauge 106 measures an atmospheric pressure (vacuum degree) inside the lens barrel 100. A gas introduction mechanism 107 is controlled by a gas control device 124 that receives a command from the main control device 121, and controls a flow rate of a gas introduced into the lens barrel 100. The gas introduction mechanism 107 is installed in a vicinity of the sample stage 105, and can inject a gas to the sample (illustrated) mounted on the sample stage 105. A type of the gas introduced from the gas introduction mechanism 107 into the lens barrel 100 can be, for example, a rare gas, and is not limited thereto. The gas introduction mechanism 107 is installed in the vicinity (directly above) of the sample stage 105, and can directly inject the introduced gas to the sample attached to the sample stage 105.

Since in-situ observation aims to observe how the sample reacts in an actual environment, it is necessary to bring a vicinity of the sample into a state close to the actual environment. By introducing the gas into the vicinity of the sample, an atmosphere in the vicinity of the sample can be brought close to an atmospheric pressure at which the sample actually reacts. Since an atmosphere having any atmospheric pressure can be formed by adjusting a gas introduction amount, various samples can be observed by an in-situ mode.

Figure 2:
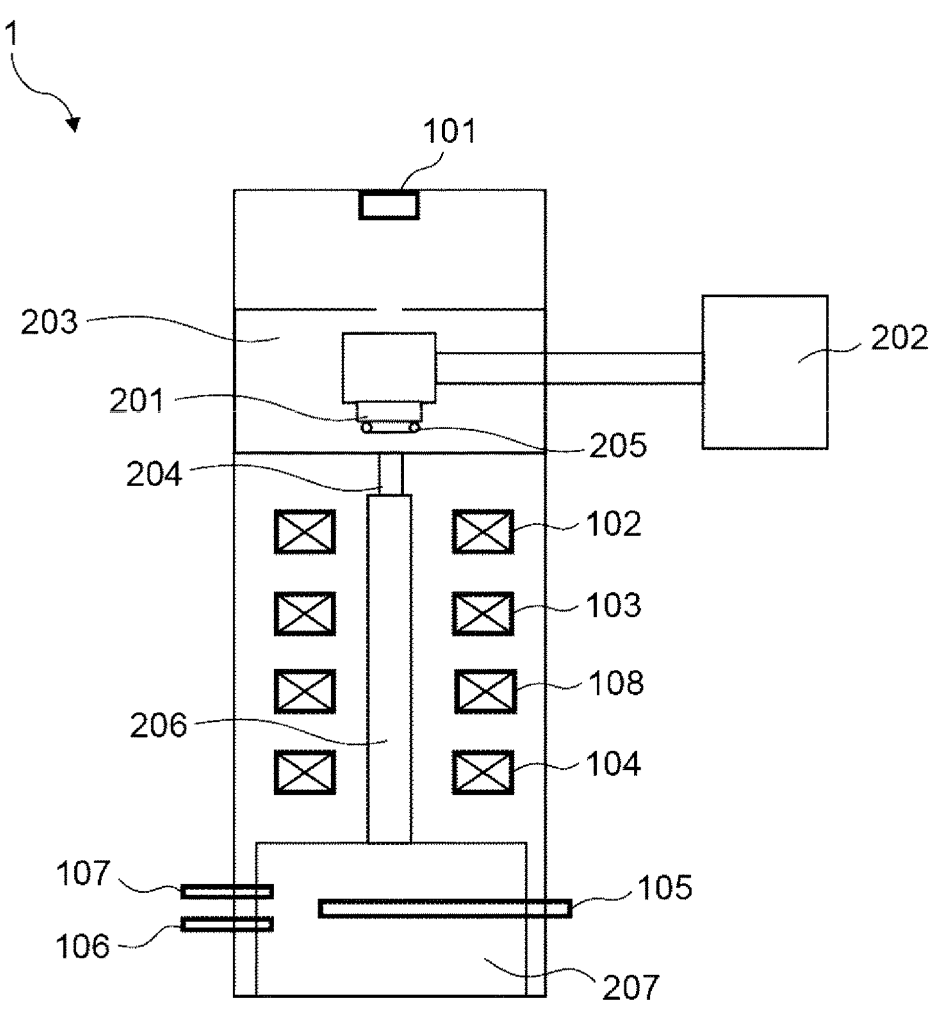
FIG. 2 is an enlarged view of a vicinity of a pressure maintaining space 203.

FIG. 2 is an enlarged view of the vicinity of the pressure maintaining space 203. The pressure maintaining space 203 using a differential exhaust throttle 204 is disposed between an electron gun 101 and the irradiation lens 102. Even if the gas is introduced into the vicinity of the sample by an action of the pressure maintaining space 203, influence of the gas on the electron gun 101 can be minimized.

The inside of the lens barrel 100 is divided into a space on an electron gun 101 side (first space) and a space on a stage side (second space) using a bottom surface of the pressure maintaining space 203 as a boundary, and the two spaces are airtightly sealed by the differential exhaust throttle 204 and a diaphragm 201. Accordingly, the influence of the gas can be further reduced.

The diaphragm 201 is attached to a tip end of a diaphragm insertion and extraction mechanism 202. The diaphragm 201 can incorporate a vacuum seal unit 205 to maintain a pressure difference in the pressure maintaining space 203. A pressure difference can be maintained between upper and lower sides of the differential exhaust throttle 204 (electron gun 101 side and irradiation lens 102 side) by the vacuum seal unit 205. The maintaining of the pressure difference means that, even if one of the spaces using the diaphragm 201 as a boundary is at an air pressure and the other space is at about $10^{-5}$ Pa, the spaces are not influenced by the pressure difference. This numerical value is an example, and for example, a pressure difference between the air pressure and an ultrahigh vacuum degree (atmospheric pressure less than $10^{-5}$ Pa) may be maintained.

The diaphragm insertion and extraction mechanism 202 can move the diaphragm 201 between a position (first position) at which the diaphragm 201 airtightly seals the pressure maintaining space 203 and passes an electron beam and a position (second position) at which the diaphragm 201 does not airtightly seal the pressure maintaining space 203 and does not collide with the electron beam. The diaphragm insertion and extraction mechanism 202 can move the diaphragm 201 in both a horizontal direction (direction in a plane orthogonal to an optical axis of the electron beam) and a vertical direction (direction parallel to the optical axis of the electron beam). As a movement mechanism, a DC motor, a stepping motor, an air cylinder, or the like can be used.

Figure 3:
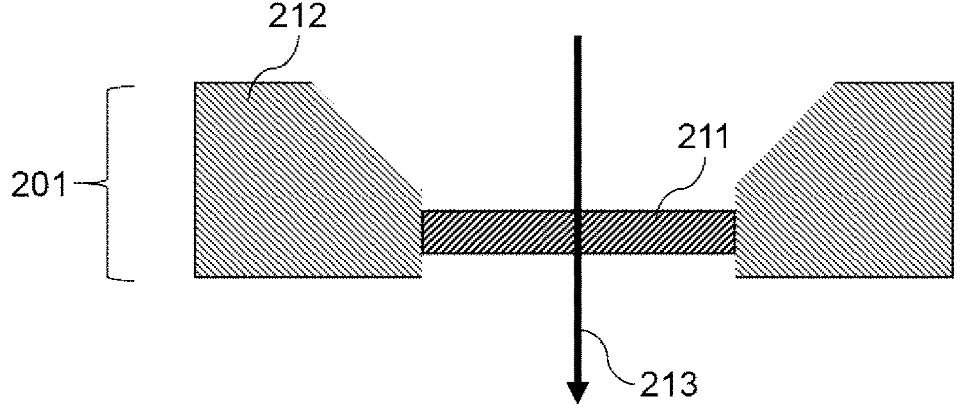
FIG. 3 is a side sectional view illustrating a structure of a diaphragm 201.

FIG. 3 is a side sectional view illustrating a structure of the diaphragm 201. The diaphragm 201 includes a conductive film 211 and a base 212. The conductive film 211 is made of a material that can allow at least a part of an electron beam 213 to pass through and withstand a pressure difference generated on both sides of the conductive film 211. The base 212 has a hole through which the electron beam 213 passes, and the conductive film 211 blocks the hole.

A film thickness of the conductive film 211 is, for example, several nm to several hundred nm in consideration of the maintaining of the pressure difference and transmission of the electron beam 213. A relationship between the transmission of the electron beam 213 and the maintaining of the pressure is a trade-off relationship between the film thickness and a size of the base 212. For example, although it is advantageous to reduce the film thickness to transmit the electron beam 213, capability of the maintaining of the pressure is lowered. For example, when the size of the base 212 is 0.5 mm×0.5 mm, the film thickness of the conductive film 211 is several tens of nm.

An O-ring for vacuum maintaining is incorporated in the diaphragm 201. Since the conductive film 211 is a thin film of several tens of nm, the conductive film 211 may be damaged when the diaphragm 201 is moved. Therefore, in order to reduce vibration of the diaphragm 201, the O-ring is used to isolate the vibration.

When the conductive film 211 is disposed on an optical axis of the electron beam 213, the electron beam 213 is scattered on the conductive film 211, and a spot diameter is increased. Therefore, in Embodiment 1, the diaphragm 201 and the diaphragm insertion and extraction mechanism 202 are disposed above the irradiation lens 102 (side close to the electron gun 101). Accordingly, by using a reduction action of the irradiation lenses 102 to 104, scattering influence can be reduced in accordance with the spot diameter, and influence on the spot diameter can be reduced.

Although the conductive film 211 can maintain the pressure difference by itself, when the conductive film 211 is installed in the lens barrel 100, vacuum sealing between the diaphragm 201 and a seal surface is required. The vacuum seal unit 205 is a member for the above. The vacuum seal unit 205 does not need to seal a space on a diaphragm insertion and extraction mechanism 202 side, and may seal, for example, a space on a differential exhaust throttle 204 side. In addition, as the diaphragm 201 is installed, the vacuum seal unit 205 may be disposed in a place where it is necessary to maintain the vacuum.

Embodiment 1: Modes of Diaphragm 201

When a silicon nitride film or the like is used as the conductive film 211, a phenomenon occurs in which a contrast of a noncrystalline portion such as an amorphous portion is superimposed on a contrast of an actual sample on a TEM observation image, and a correct contrast of the TEM image cannot be obtained. Therefore, in Embodiment 1, a first mode (mode in which the diaphragm 201 is disposed at the first position) in which the diaphragm 201 is disposed on the optical axis of the electron beam and a second mode (mode in which the diaphragm 201 is disposed at the second position) in which the diaphragm 201 is removed from the optical axis are provided. The diaphragm insertion and extraction mechanism 202 can switch between the first mode and the second mode according to a command from the main control device 121.

In the first mode, the diaphragm 201 is in a state of being inserted onto the optical axis of the electron beam. In the first mode, the diaphragm 201 maintains a pressure difference between upper and lower sides of the pressure maintaining space 203, and the electron beam transmitted through the conductive film 211 is emitted to the sample. The transmitted electron beam is image-formed by the image forming lenses 110 to 113, is image-formed on the CCD camera 114, and an observation image is displayed on the display device 123 via the main control device 121. Since the electron beam transmits through the conductive film 211, the electron beam is influenced by a phase contrast during high resolution observation, and is less influenced by a phase contrast during low magnification observation (low resolution). Therefore, in the first mode, priority is given to observation in a state in which a pressure in the vicinity of the sample is increased, rather than the resolution.

In the second mode, the diaphragm 201 is removed from the optical axis of the electron beam, and the pressure difference between the upper and lower sides of the pressure maintaining space 203 is maintained only by the differential exhaust throttle 204. The electron beam is emitted to the sample without being influenced by the conductive film 211, and is image-formed in the same manner as in the first mode. The second mode is the same as that of a general transmission electron microscope, and nothing is on the optical axis of the electron beam. Therefore, image observation with high resolution is possible without being influenced by the electron beam scattering and the phase contrast in the diaphragm 201.

There is a sample in which a behavior of a material is changed by exposure to atmosphere, such as an oxidation-reduction reaction. For such a sample, the same reaction can be observed by introducing air in the first mode. In addition, a state after the reaction can also be observed with high resolution by the second mode.

Figure 4:
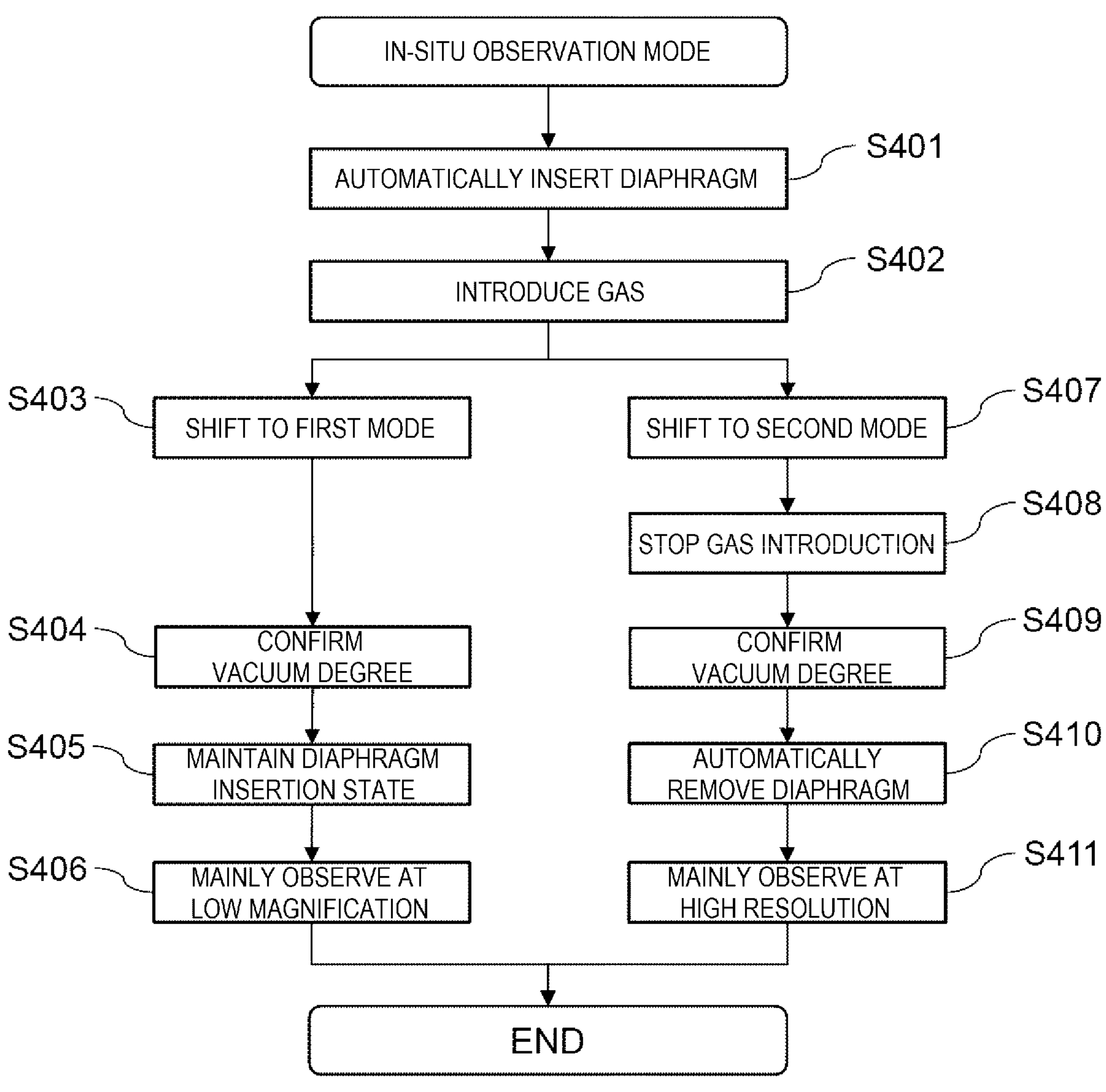
FIG. 4 is a flowchart illustrating an operation procedure of the transmission electron microscope 1.

FIG. 4 is a flowchart illustrating an operation procedure of the transmission electron microscope 1. When the transmission electron microscope 1 shifts to an in-situ observation mode, the flowchart is started. An instruction to shift to the in-situ observation mode is, for example, input to the main control device 121 by an operator via an appropriate interface. Each step in FIG. 4 will be described below.

(FIG. 4: Step S401)

The main control device 121 instructs the diaphragm insertion and extraction mechanism 202 to dispose the diaphragm 210 at the first position (position when the first mode is performed). The diaphragm insertion and extraction mechanism 202 moves the diaphragm 201 according to the instruction.

(FIG. 4: Step S402)

The main control device 121 controls the gas introduction mechanism 107 to introduce a gas into the lens barrel 100. At this time point, since the diaphragm 201 is in a position of the first mode, the pressure maintaining space 203 is airtightly sealed.

(FIG. 4: Step S403)

When the operator instructs the main control device 121 to perform the first mode, the main control device 121 executes S403 to S406 (first mode).

(FIG. 4: Step S404)

The main control device 121 acquires a measurement result by the vacuum gauge 106. After confirming that the vacuum degree is a value suitable for the first mode (state in which the pressure in the vicinity of the sample is relatively increased by the gas introduction), the process proceeds to step S405. When the vacuum degree is excessively low (flow rate of the gas is excessively high), either one of decreasing the gas introduction amount or increasing the exhaust capacity of the evacuation pump 131 is performed. When the vacuum degree is excessively high (flow rate of the gas is excessively low), either one of increasing the gas introduction amount or decreasing the exhaust capacity of the evacuation pump 131 is performed. This step is continued until the vacuum degree becomes the value suitable for the first mode.

(FIG. 4: Steps S405 to S406)

The main control device 121 maintains the diaphragm 201 at the first position (S405), and acquires an observation image of the sample at low magnification (S406).

(FIG. 4: Steps S407 to S411)

When the operator instructs the main control device 121 to perform the second mode, the main control device 121 executes S407 to S411 (second mode).

(FIG. 4: Step S408)

The main control device 121 controls the gas introduction mechanism 107 to stop the gas introduction. This is because, since the second mode is a mode in which the sample is observed in a state in which the vacuum degree is increased, it is desirable that a gas concentration in the vicinity of the sample be low. Instead of stopping the gas introduction, the vacuum degree in the vicinity of the sample may be increased by increasing the exhaust capacity of the evacuation pump 131 to be higher than when the first mode is performed. The above may be used in combination.

(FIG. 4: Step S409)

The main control device 121 acquires a measurement result by the vacuum gauge 106. After confirming that the vacuum degree is a value suitable for the second mode (state in which the pressure in the vicinity of the sample is relatively low), the process proceeds to step S410. When the vacuum degree is excessively low (pressure is excessively high), the evacuation pump 131 waits for evacuating the vicinity of the sample by continuing this step. When the vacuum degree is excessively high (pressure is excessively low), either one of restarting the gas introduction or decreasing the exhaust capacity of the evacuation pump 131 is performed. This step is continued until the vacuum degree becomes the value suitable for the second mode.

(FIG. 4: Steps S410 to S411)

The main control device 121 moves the diaphragm 201 to the second position (S410), and mainly acquires an observation image with high resolution of the sample (S411).

In FIG. 4, gas reaction of the sample may be observed using the first mode, and then shifted to the second mode to observe with high resolution. In this way, the first mode and the second mode may be combined. In the second mode, various analysis devices such as energy dispersive X-ray analysis (EDX) and electron energy loss spectroscopy (EELS) can be used.

Embodiment 1: Summary

The transmission electron microscope 1 according to Embodiment 1 switches between the first mode in which the diaphragm 201 airtightly seals the pressure maintaining space 203 and transmits the electron beam and the second mode in which the diaphragm 201 does not airtightly seal the pressure maintaining space 203 and does not collide with the electron beam. Accordingly, in the first mode, priority can be given to observation in a state in which the pressure in the vicinity of the sample is higher than the resolution of the observation image, and in the second mode, priority can be given to observation with high resolution by avoiding a problem that the phase contrast of the diaphragm 201 and the contrast of the actual sample are superimposed. Therefore, the in-situ observation can be appropriately performed according to characteristics of an observation target.

In the transmission electron microscope 1 according to Embodiment 1, when shifting to the in-situ observation mode, the diaphragm 201 is moved to the position of the first mode, and then the gas introduction into the lens barrel 100 is started. When the first mode is performed, the diaphragm 201 is maintained at the first position, and the observation image is obtained using an electron beam transmitted in the state in which the vacuum degree becomes the value suitable for the first mode. Accordingly, the user can automatically perform an operation mode suitable for the in-situ observation only by designating the observation mode to obtain the observation image.

In the transmission electron microscope 1 according to Embodiment 1, when shifting to the in-situ observation mode, the diaphragm 201 is moved to the position of the first mode, and then the gas introduction into the lens barrel 100 is started. When the second mode is performed, the observation image is obtained using an equivalent electron beam in a state in which the gas is removed until the vacuum degree is sufficiently increased and then the diaphragm 201 is moved to the second position. Accordingly, the user can automatically perform the operation mode suitable for the in-situ observation only by designating the observation mode to obtain the observation image.

In Embodiment 1, by using a material such as metal instead of the conductive film 211 and completely sealing the pressure maintaining space 203, it is conceivable to properly use an operation mode in which the sample is reacted and an operation mode in which the sample is observed while maintaining the pressure difference. However, as in the first mode according to Embodiment 1, a use mode in which the electron beam transmits through the diaphragm while increasing the pressure in the vicinity of the sample is difficult. Therefore, as in Embodiment 1, the configuration for switching between the first mode and the second mode is useful in switching the operation mode according to an observation purpose.

Embodiment 2

The configuration for switching between the first mode and the second mode described in Embodiment 1 can also be used in a scanning transmission electron microscope (STEM). In the STEM, various information can be obtained by narrowing down an electron beam and operating the electron beam on a sample. In particular, since an HAADF image is a Z-contrast image, the STEM is a useful observation method. In the STEM, a probe diameter of the electron beam is directly linked to resolution. When the electron beam is narrowed down as much as possible, observation with high resolution is possible.

A gas introduced by the gas introduction mechanism 107 fills an irradiation system pipe 206 and a sample chamber 207. When pressures thereof are high (under high pressures), the electron beam emitted from the electron gun 101 is scattered and a spot diameter of the electron beam becomes large, which is not suitable for the observation with high resolution using the STEM. Therefore, similarly to Embodiment 1, by properly using the first mode and the second mode according to the observation purpose, STEM image observation can be performed under an appropriate observation condition. A vacuum degree and scattering of the electron beam are correlated, and control can be performed by the vacuum degree. From this viewpoint, it is also useful to properly use the first mode and the second mode.

Embodiment 3

In STEM image observation, a spherical aberration can be reduced by using the aberration corrector 108. Accordingly, a probe diameter is narrowed down and observation with high resolution is possible. In a magnetic field lens used in an electron microscope or the like, an electron beam passing through a place away from a center of a lens is refracted largely. Accordingly, the electron beam cannot be focused at one point on a surface of a sample, and the probe diameter becomes large. On the other hand, when the aberration corrector 108 is used, the refraction caused by the magnetic field lens can be cancelled, and the probe diameter on the surface of the sample can be made small (thin).

When the aberration corrector 108 is used, it is necessary to correct an established aberration in advance. For example, a method using an amorphous region and a transmission image (Ronchigram image) and a correction method using an actual image are generally used.

When the diaphragm 201 is inserted onto an optical axis of the electron beam, the aberration correction method using the transmission image is influenced by a phase contrast as in a TEM, an optimal transmission image (Ronchigram image) cannot be observed, and the spherical aberration cannot be corrected. This is because an amorphous contrast is superimposed on the transmission image. In the method using the actual image, the aberration is corrected while observing an HAADF image and the like. In this case, other factors such as electron beam scattering in the diaphragm 201 occur, and similarly the aberration cannot be appropriately corrected.

Therefore, in Embodiment 3, the aberration corrector 108 corrects the aberration in a second mode in which the diaphragm 201 is removed, and an observation image is obtained in a first mode in which the diaphragm 201 is inserted. Other configurations are the same as those in Embodiments 1 and 2.

Figure 5:
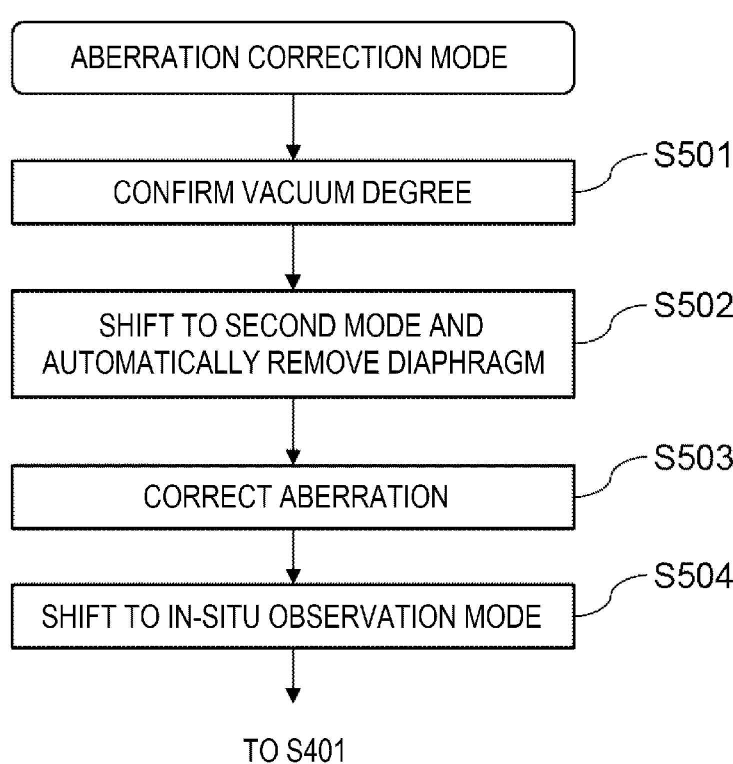
FIG. 5 is a flowchart illustrating a procedure for correcting an aberration using an aberration corrector 108.

FIG. 5 is a flowchart illustrating a procedure for correcting the aberration using the aberration corrector 108. When a user instructs the main control device 121 to perform an aberration correction mode, the main control device 121 starts this flowchart. The main control device 121 acquires a measurement result of the vacuum gauge 106 and confirms whether a vacuum degree in the lens barrel 100 is a value suitable for the second mode (S501). When the vacuum degree is not appropriate, the process waits until an appropriate vacuum degree is obtained as in FIG. 4. The main control device 121 shifts to the second mode and moves the diaphragm 201 to a second position (S502). The main control device 121 adjusts an aberration correction amount of the aberration corrector 108 (S503). An adjustment method is as described above. After the correction amount is adjusted, the process shifts to the flowchart in FIG. 4 (S504).

Embodiment 4

Figure 6:
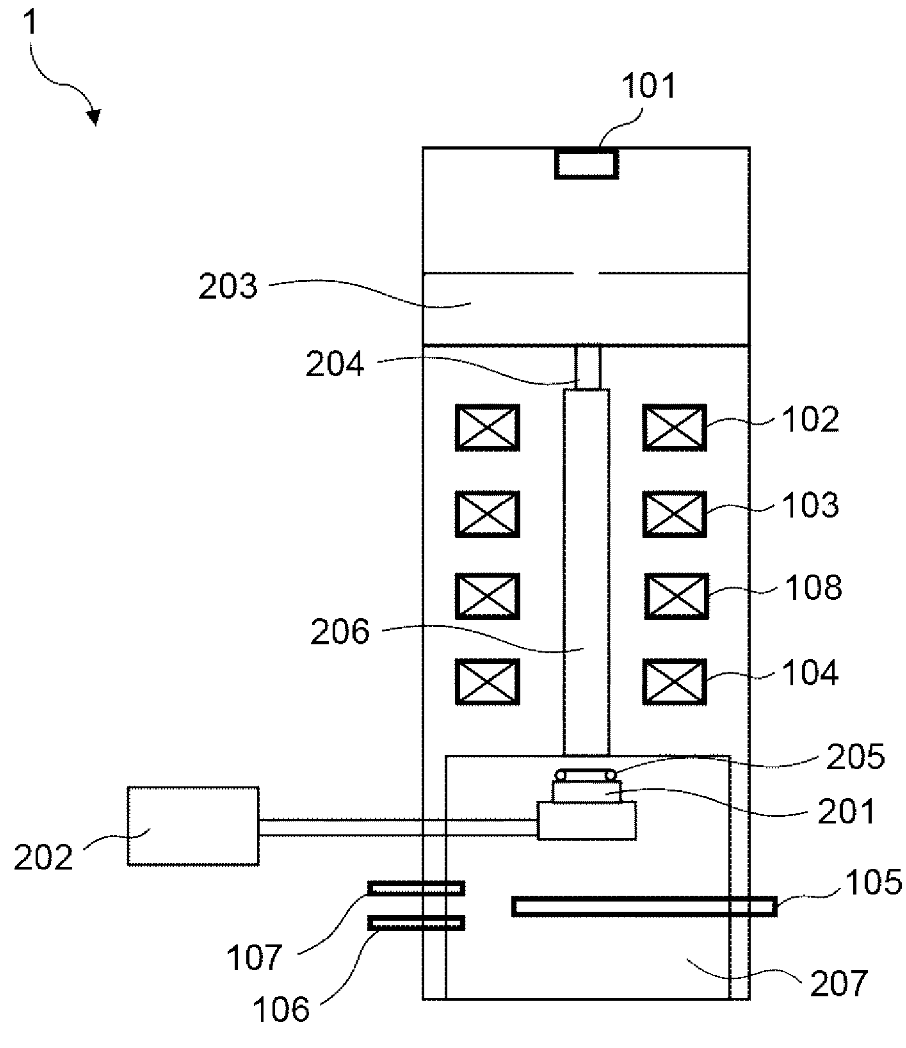
FIG. 6 is a schematic side view illustrating a configuration of the transmission electron microscope 1 according to Embodiment 4.

FIG. 6 is a schematic side view illustrating a configuration of the transmission electron microscope 1 according to Embodiment 4 of the invention. In Embodiments 1 to 3, the diaphragm 201 is installed in the pressure maintaining space 203 above the irradiation lens 102. Alternatively, the diaphragm 201 may be installed in the sample chamber 207 as illustrated in FIG. 6. From a viewpoint of electron beam scattering, it is desirable that a gas atmosphere region be as short as possible. Therefore, in Embodiment 4, the diaphragm 201 is provided just above a sample. Other configurations are the same as those in Embodiments 1 to 3.

A gas introduced from the gas introduction mechanism 107 in a first mode fills only the sample chamber 207 and does not influence an inside of the irradiation system pipe 206. Therefore, influence of electron beam scattering due to the introduced gas can be minimized.

Modifications of the Invention

The invention is not limited to the embodiments, and includes various modifications. For example, the embodiments have been described in detail for easy understanding of the present disclosure, and are not necessarily limited to those having all the configurations described above. A part of a configuration according to one embodiment can also be replaced with a configuration according to another embodiment, and a configuration according to one embodiment can also be added to a configuration according to another embodiment. A part of a configuration according to each embodiment may be added to, deleted from, or replaced with another configuration.

In the above embodiments, a transmission electron microscope has been described, and the invention can be applied to other charged particle beam devices including an ion microscope. That is, the invention can be used to switch between a first mode and a second mode in a charged particle beam device that needs to airtightly seal a pressure maintaining space in a lens barrel.

REFERENCE SIGNS LIST

100: lens barrel
101: electron gun
102 to 104: irradiation lens
105: sample stage
106: vacuum gauge
107: gas introduction mechanism
108: aberration corrector
110 to 113: electron lens
114: CCD camera
120: control board
121: main control device
122: lens control device
123: display device
124: gas control device
201: diaphragm
202: diaphragm insertion and extraction mechanism
203: pressure maintaining space
204: differential exhaust throttle
205: vacuum seal unit
206: irradiation system pipe
207: sample chamber
211: conductive film
212: base

The invention claimed is:

1. A transmission electron microscope for observing a sample using an electron beam transmitted through the sample, the transmission electron microscope comprising:
- an electron beam source configured to emit the electron beam;
- a stage on which the sample is placed;
- a lens barrel configured to house the electron beam source and the stage;
- a diaphragm configured to airtightly seal a first space on an electron beam source side and a second space on a stage side inside the lens barrel; and
- a mechanism configured to move the diaphragm; and
- an irradiation lens configured to focus the electron beam between the electron beam source and the stage, wherein
- the diaphragm is disposed between the electron beam source and the irradiation lens,
- the diaphragm includes a transmission portion that transmits at least a part of the electron beam,
- the mechanism includes a movement mechanism different from a stage mechanism for moving or inclining the stage, and
- the mechanism is configured to switch between:
  - a first mode in which the diaphragm is disposed at a first position at which the diaphragm airtightly seals the first space and the second space and transmits at least a part of the electron beam; and
  - a second mode in which the diaphragm is disposed at a second position at which the diaphragm does not airtightly seal the first space and the second space and does not collide with the electron beam.

2. The transmission electron microscope according to claim 1, further comprising:
- a main control device configured to generate an observation image of the sample using the electron beam transmitted through the sample; and
- a vacuum gauge disposed in the second space and configured to measure a vacuum degree inside the lens barrel, wherein
- the mechanism moves the diaphragm to the first position before performing the first mode or the second mode, and
- in the first mode, the main control device generates the observation image by using the electron beam transmitted through the sample at a time point when the vacuum degree inside the lens barrel reaches a first vacuum degree.

3. The transmission electron microscope according to claim 2, wherein when shifting from the first mode to the second mode, the mechanism moves the diaphragm from the first position to the second position at a time point when the vacuum degree inside the lens barrel reaches a second vacuum degree higher than the first vacuum degree, and in the second mode, the main control device generates the observation image by using the electron beam transmitted through the sample at the time point when the vacuum degree inside the lens barrel reaches the second vacuum degree.

4. The transmission electron microscope according to claim 1, further comprising:

a gas introduction valve configured to introduce a gas into the lens barrel, wherein the gas introduction valve introduces the gas into the lens barrel before the mechanism performs the first mode or the second mode, and in the second mode, the gas introduction valve stops the introduction of the gas before the mechanism moves the diaphragm from the first position to the second position.

5. The transmission electron microscope according to claim 1, further comprising:

a gas introduction valve configured to introduce a gas into the lens barrel; and an exhaust device configured to evacuate the inside of the lens barrel, wherein the gas introduction valve introduces the gas into the lens barrel before the mechanism performs the first mode or the second mode, and in the second mode, the exhaust device evacuates the inside of the lens barrel with exhaust capacity higher than exhaust capacity in the first mode before the mechanism moves the diaphragm from the first position to the second position.

6. The transmission electron microscope according to claim 1, further comprising:

an aberration corrector configured to correct an aberration of the electron beam; and a main control device configured to control a correction amount of the aberration corrector, wherein the mechanism shifts to the second mode before the main control device determines the correction amount, and in the second mode, the main control device determines the correction amount by using the electron beam transmitted through the sample.

* * * * *